United States Patent [19]
Crabtree

[11] 3,946,632
[45] Mar. 30, 1976

[54] REGISTER CONTROL PUNCH

[76] Inventor: Ralph E. Crabtree, 804 W. Springfield, Champaign, Ill. 61820

[22] Filed: June 13, 1974

[21] Appl. No.: 479,034

[52] U.S. Cl. .................. 83/451; 83/468; 83/520; 83/522; 83/564; 83/685
[51] Int. Cl.² .... B26D 7/02; B26D 7/16; B26D 5/10
[58] Field of Search ....... 83/33, 451, 468, 520, 522, 83/564, 633, 452, 454, 456, 464, 83/468, 467, 685

[56] References Cited
UNITED STATES PATENTS

| | | | |
|---|---|---|---|
| 3,211,039 | 10/1965 | Sheetz | 83/520 |
| 3,322,014 | 5/1967 | Boragina et al. | 83/468 |
| 3,492,900 | 2/1970 | Hill et al. | 83/464 |
| 3,524,372 | 8/1970 | Albrecht | 83/451 |
| 3,667,334 | 6/1972 | Brunett | 83/467 X |

*Primary Examiner*—Willie G. Abercrombie
*Attorney, Agent, or Firm*—David V. Munnis

[57] ABSTRACT

Hole punching apparatus for punching registration holes for graphic arts sheets, steps, etc. including table support means (e.g., a graphic artist's light table) having a grooved guide channel for registration pins along one side and a second similar grooved guide channel perpendicular to the first and positioned intermediate the ends of the first, a single hole punching means having a depressable position-retaining means for sheet material being punched and whose punch axis is aligned at the intersection of the two grooved guide channels, and three registration pin assemblies, one each of which assemblies is separately slideably positioned in one of the three legs of the intersecting grooved guide channel. The registration pin assemblies being adapted to be locked in a fixed position.

The registration control punch of the present inventnion is capable of providing accurately spaced registration holes on both edges of graphic art sheet material without any requirement that the sheet material have straight edges.

8 Claims, 4 Drawing Figures

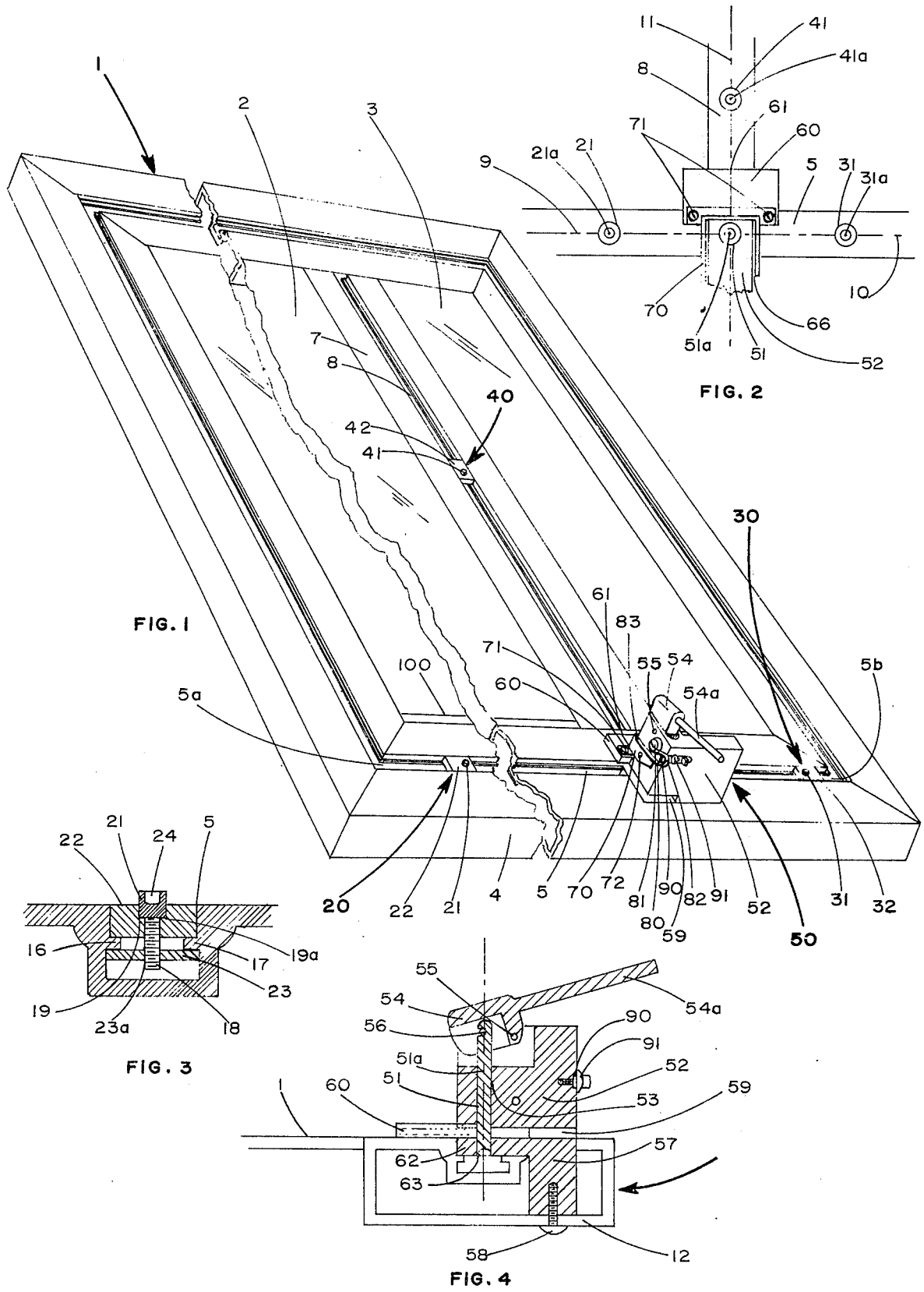

REGISTER CONTROL PUNCH

BACKGROUND OF THE INVENTION

This invention relates to means for and method of preparing printing plates having multiple images in an exact relationship to each other.

The object of this invention is to provide means for preparing printing plates in a more economical and more accurate method than has heretofore been possible.

In making printing plates, multiple negatives or positives, the image or images are photographically repeated by the use of a negative or positive contained in the subject, the negative or positive being photographically derived from the original drawing.

In the field of printing, there is a need for what is termed stepping over and up of an image on a sensitized plate or negative-type material to provide multiple images each in the exact relationship to the other images. In this field it is also necessary to prepare more than one plate, negative or positive, with multiple images on each, with each representing a color of a multiple color printing job. In such an instance, the relationship of the images not only for one color but for all colors in the multiple color operation.

If the image is to be stepped horizontally and vertically, it not only must have the holes horizontally as above indicated, but also have sets of holes in proper relationship in a vertical manner. There must be as many sets of holes as there are vertical steps. It is important in stepping vertically and horizontally that holes be in absolute alignment with each other.

Various punching apparatus for punching registration holes have been suggested in the prior art involving, interalia, slideable hole punching means, guide pins and guide straight edges. Punching devices previously suggested, however, have not provided totally suitable overall performance in terms of speed and/or accuracy or being limited in the capability of utilizing only the accurately sized sheet material or of producing accurate punching on only one side of the sheet material.

OBJECTS OF THE INVENTION

Accordingly, it is the primary object of the present invention to provide a punch which can be utilized for precisely punching and spacing registration holes.

Another object of the invention is to provide a punch in which precise control can be speedily achieved.

An additional object of the invention is to provide a registration punch of the above character in which the exact spacing desired between the punched holes can be readily and precisely controlled.

A further object of the invention is to provide a registration punch of the above character which makes it possible to precisely position a plurality of holes.

Still another object of the invention is to provide a registration punch capable of speedily and accurately punching desired registration holes on opposite edges of sheet material.

Yet an additional object of the invention is to provide a punch capable of speedily and accurately punching a plurality of registration holes in a sheet material irrespective of the evenness of the edge of the sheet material.

DETAILED DESCRIPTION OF THE DRAWINGS

The above and other objects are satisfied by the register control punch of the present invention. Broadly described, the present invention provides register control punch assembly comprising a flat support surface, said support surface having at least two longitudinally extending grooves formed therein, said longitudinally extending grooves being relatively positioned such that the respective center lines thereof intersect perpendicularly at a point intermediate the ends of one of said grooves, hole punching means having a plunger adapted to punch a single hole in a sheet of material, said punching means being positioned such that the axis of said plunger thereof is perpendicular to said support surface and intersects said support surface at said intersection of said center lines of said two longitudinal grooves, means associated with said punch retaining sheet material being punched by said plunger in a position normal to said axis of said plunger, a vertical register hole guide pin positioned within each of the resultant three legs of said two intersection grooves in said support surface, means associated with each of said guide pins adapting each of said pins for slideable movement along each of said grooves and for locking said pins in place at a preselected position.

The punch of the invention is hereinafter described more fully with reference to the attached drawings of which:

FIG. 1 is a view in perspective of an embodiment of the punch assembly in the present invention;

FIG. 2 is a schematic partial top view of the punch assembly shown in FIG. 1 representing the relative positioning of the three guide pins and the punch plunger of the punch assembly;

FIG. 3 is a partial view taken in section of a pin guide assembly;

FIG. 4 is a partial view taken in section showing the hole punching means of the assembly shown in FIG. 1.

Referring to FIG. 1 of the attached drawings, 1 is a flat support surface provided in the register control punch of the present invention. In general, support surface 1 suitably may be any flat surface provided by a table top and the like, but for space economy, in the preferred embodiments of the register punch apparatus of the present invention, the support surface 1, as shown in FIG. 1, comprises glass rectangular panels 2 and 3 constituting the top of a graphic arts light table, grooved channel member 7 which separates plates 2 and 3 and grooved channel member 4 which surrounds the periphery of plates 2 and 3.

Channel member 7, which bisects support surface 1, and channel member 4 are provided with longitudinally extending grooves 8 and 5 therein, respectively, with grooves 5 and 8, being relatively positioned such that center line 11 of groove 8 intersects center line 9 of groove 5 perpendicularly and at a point intermediate the ends of groove 5.

A means 50 for punching holes is positioned above the upper surface of support surface 1 and provided with a plunger 51 adapted for reciprocal vertical movement, and to be received within a female die member 62 which is integral with punch body 52 and has an opening 63 therein adapted to receive plunger 51. The cooperative effect of plunger 51 and female member 62 are adapted to provide a series of punched holes in a straight line in a sheet of material placed in a slot opening 59 in body 52 between same wherein the center line of the holes is either parallel or perpendicular to center line 9 of groove 5. Female die member 62 divides groove 5 in channel member 4 into separate groove sections 5a and 5b having a common center line represented by center line 9, 10.

A particular feature of the present invention is that punch means 50 is so positioned such that center line (i.e., axis) 51a of plunger 51 is normal to the upper flat horizontal surface of support surface 1 and intersects support surface 1 at a point coinciding with the intersection of center line 11 and center line 9, 10 of channels 8 and 5 respectively.

In accordance with the register control punch of the present invention punch means 50 is adapted, through the cooperative effect of plunger 51 and female die member 62, to punch one hole in a sheet of material placed there between and upon plunger being actuated. In specific embodiments of the control punch of the present invention, the means provided for actuating plunger 51 suitably may be actuatable by any available expedient, including means actuatable mechanically, hydraulically, and/or electrically.

In the embodiment shown in the attached Figs., plunger 51 is mechanically actuated. In the embodiment shown, punch 50 comprises a body 52 having a vertical guide opening 53 therethrough which receives plunger 51 and in which plunger 51 is adapted for a relatively snug reciprocal vertical movement. Plunger 51 is pivotally attached at its upper end through a horizontal pin 56 to a handle 54 which in turn is pivotally connected through a horizontal pin 55 to body 52. With this communicating attachment, plunger 51 is depressed when end 54a of handle 54 is raised and raised when handle 54a is depressed. In certain embodiments of the control punch of the invention plunger 51 suitably may be provided with biasing means (not shown), e.g., a spring, which must be overcome when plunger 51 is actuated to produce the desired hole punching.

In accordance with the control punch of the present invention, means associated with punching means 50 are provided for retaining sheet material being punched in position and against lateral or vertical movement during the punching step.

Such position-retaining means is adapted to effect the desired sheet "hold-down" in the area immediately adjacent the contact point of plunger 51, die member 62 and is adapted for reciprocal or pivotal vertical movement to allow sheet material to be initially inserted thereunder and during the actuation thereof and its requisite, resultant downward vertical movement held against the upper flat horizontal surface of support surface 1.

In the embodiment shown in the drawings, the sheet position-retaining means is provided by a rectangular plate 60 of transparent material, such as plexiglass and the like, which on one side has a cutaway area 66 into which body 52 of punch means 50 is adapted to fit. Plate 60 is fixedly attached such as by screw 71 to an extension arm member 70 which is pivotally attached for vertical movement to body 52 by a horizontal pin 72. Plate 60 is provided with an indicator line 61 inscribed on the bottom surface thereof and extending longitudinally thereof in a direction and in a position such that indicator line 61, when plate 60 is in its lower position, coincides with center line 11 of groove 8.

Biasing means consisting of a U-shaped spring 80 is provided for adapting plate 60 normally to be in a raised position and for lowering plate 60 by causing same to pivot downwardly around pin 72, when spring 80 is actuated. In practice, spring 80 is actuated by elevating the rearwardly extending bend 82 thereof and depressing spring 80 against retention pin 81 thereby causing the forwardly extending free end 83 of spring 80 to force extension arm 70 to pivot downwardly in a counterclockwise direction around pin 72.

Means for locking position-retaining plate 60 in its depressed and sheetretaining position are provided by a slotted bar 90 attached to punch body 52 by a screw 91, with bar 90 being adapted for slideable horizontal movement traverse of screw 91 and to form an extension thereof lateral of the side of punch body 52 which is adapted to be received within and retained within curved end 82 of spring 80 when spring 80 is in the raised, actuated position.

In accordance with the register control punch of the present invention, each of the three legs of the perpendicularly intersecting longitudinal grooves in support surface 1, as shown, represented by transverse groove 8 and side groove segments 5a and 5b, is provided with a guide pin assembly which is adapted for slideable movement along the respective groove in which it is seated and is further adapted to be locked in place at a desired position. Each guide pin assembly comprises a pin member which extends vertically above the upper flat horizontal surface of support surface 1 and which has a horizontal cross-sectional area identical to that of a punched hole formed by the cooperating effect of the male and female members of punch means 50.

In the design shown, identical guide pin assemblies 20, 30, and 40 are positioned within groove segment 5a, groove segment 5b, and groove 8, and provided with vertical guide pin elements 21, 31, and 41, respectively. A feature of the register control punch of the present invention is that the centers (axes) 21a and 31a of pin members 21 and 31 and center (axis) 51a of plunger 51 all lie on common center line 9-10 of groove segments 5a and 5b and that center (axis) 51a of plunger 51 and the center (axis) 41a of pin element 41 lie on center line 11 of groove 8, with the horizontal cross-sectional areas of pin elements 21, 31, and 41, and plunger 51 all being identical. The particular design of the cross-sectional area employed suitably may vary and include rectangular and arcuate sections, but preferably is circular as shown in FIG. 2.

Each guide pin assembly of the register control punch of the present invention has associated therewith means for adapting same for slideable movement within the longitudinal groove in which it is located and means for locking same in position at a desired location. in the design shown, with particular reference to FIG. 3 which shows the arrangement of guide pin assembly 20 (guide pin assemblies 30 and 40 are correspondingly identical thereto), the body of assembly 20 is provided by separate rectangular bar members 22 and 23 having a width such that they snugly but slideably fit within the vertical walls of slot 5. Upper bar member 22 is supported and slides along inwardly extending horizontal flange members 16 and 17 positioned on the opposite vertical walls of slot 5. Lower bar member 23 is connected to upper bar member 22 by pin element 21 having a downwardly extending, threaded portion 18 which cooperates with threaded grooves 23a in lower bar member 23.

Pin element 21 seats snugly but rotatably within an annular opening 19 through upper bar member 22 having a shoulder 19a which supports the body of pin 21. Pin element 21 at its top is provided with a recess 24 which is adapted to receive the end of a means for rotating pin 21 such as a key, wrench, and the like. In use, pin 21 is suitably rotated by a key and the like to lower bottom bar member 23 from engagement with locking flanges 16 and 17, guide pin assembly 20 is slid along groove 5 as desired or positioned where desired within slot segment 5a and locked in place by suitably rotating pin element 21. Guide pin assemblies 30 and 40 are identically constructed as assembly 20 so that guide pins 31 and 41 can be similarly slideably moved and locked in place as desired.

In use, the register control punch of the present invention advantageously is adapted to punch a series of register control holes in a straight line along one or both opposite edges of a sheet of material such as employed in stepping and multicolor printing in the graphic arts. In preferred use, a sheet of material in which register holes are desired to be punched is laid out, e.g. measured for margins and total distance between register holes using a centering and/or measuring scale 100 provided on support surface 1 adjacent channel member 4, and punch means 50 is employed to punch a single hole in the margin thereof along one side. In punching this first hole, as also in the case of all subsequent register holes punched, the sheet material is positioned in slot 59 of punch 50 with plunger 51 being in a raised position, sheet position-retaining plate 60 is pivoted downwardly to press the sheet material against support surface 1 by manually lifting the curved end 82 of spring 80, and punch handle 54a is raised to depress plunger 51 into engagement with female die member 62. This first hole called the "pilot hole" (P hole) is then placed and fitted over vertical pin element 21 which is snugly received in the P hole, with pin assembly 20 being adjusted to slide freely in groove segment 5a.

A hole is then punched in the same margin of the sheet of material as the P hole, with the second punched hole (hole $X_1$) representing the desired register control hole which will be the farthest from the P hole on the finished punched sheet. Guide pin assembly 30 is then moved laterally within slot segment 5b and locked in place therein at a position such that the axis 31a of pin element 31 is a distance from axis 51a of plunger 51 which coincides with the distance, predetermined by the initial layout operation, that the centers of the register control holes are desired to be punched from each other in the margin in which the P hole is located. Then, with guide pin element 31 fixed in place, the sheet material to be punched is then moved laterally, with the P hole therein still being retained and fitted over "pilot" guide pin element 21, and then the next register hole (hole $X_2$) is punched. The operation is then repeated moving punched hole $X_2$ over laterally and in snug fitting engagement with "locator" guide pin element 31 to punch register hole $X_3$, and so on, up to hole $X_n$ wherein $n$ represents the total number of register controls desired to be punched in that margin, until the desired number of register holes $(n-1)$ between the "pilot" hole, P, and register hole $X_1$ are punched.

By means of the described punching procedure using the register control punch of the present invention, register control holes advantageously, accurately and speedily may be punched along one edge of any available sheet material capable of being punched by punching means 50. A particular feature of the present invention is that the method and punch assembly thereof advantageously are capable of achieving the desired accurate and rapid register control punching in sheet material available irrespective of whether or not the edge thereof is even or uneven.

A further feature of the register control punch of the present invention is that it is capable of achieving improved rapid and accurate punching of register control holes on not only one side but on both opposite sides of available sheet material. In actual use, punching on the opposite side of the sheet material may be accomplished with the punch design shown, by a process which is a continuation of the above-described process effecting a punching of register holes represented by the $X_n$ holes, punched as described above.

In such opposite side punching and using a sheet punched as described above, the resultant punched sheet is completely turned over such that the side which faced upwardly during the described initial punching of the X hole series lies face down contacting support surface 1. With guide pin assembly 30 and consequently "locator" guide pin 31 being in the same locked position as during the punching of register holes $X_1$, $X_2$, etc., guide pin assembly 40 is moved laterally and locked in a position such that the axis 41a of guide pin 41 is a sufficient distance from axis 51a of plunger 51 that holes located on the sheet material at such a distance will be in the opposite margins of the sheet material. Register hole $X_1$ in the sheet material then is fitted snugly onto guide pin element 41 and the sheet material is adjusted around axis 41a to align indicator line 61 on plate 60 with a line drawn on the sheet by mechanical means which is perpendicular to a line through the centers of register holes $X_1$, $X_2$, etc. The first register hole $Y_1$ in the opposite margin is then punched by punch means 50. The sheet then is moved laterally to fit register hole $Y_1$ snugly over "locator" pin element 31 and to fit register hole $X_2$, snungly over pin element 41, and then second opposite margin register hole $Y_2$ is punched. The operation is repeated to punch opposite register holes $Y_3$, and so on, up to the $Y_n$ hole.

A representation of the P, X, and Y holes so punched, using the above described procedure, where four sets of registration control holes were desired to be punched, thus, would be as follows:

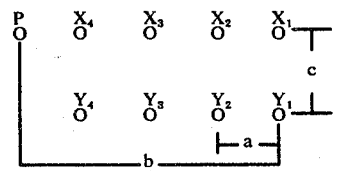

wherein $a$ is the distance axis 31a of pin 31 is fixedly positioned from axis 51a of plunger 51 to pre-determine the distance between adjacent holes to be punched in the same margin of punched sheet; $b$ is the distance (not critical) between the first punched hole (hole P) and the second punched hole (hole $X_1$) at the opposite ends of the same margin of the sheet; $c$ is the distance axis 41a of pin 41 is fixedly positioned from axis 51a of plunger 51 to pre-determine the distance between the respective X and Y holes punched on opposite margins of the sheet; O represents a punched hole; and wherein the location of the respective holes during the punching of a particular hole is as follows:

| Plunger 51 (punched hole) | Pin 21 | Pin 31 | Pin 41 |
|---|---|---|---|
| P | — | — | — |
| $X_1$ | P | — | — |
| $X_2$ | P | $X_1$ | — |
| $X_3$ | P | $X_2$ | — |
| $X_4$ | P | $X_3$ | — |
| $Y_1$ | — | — | $X_1$ |
| $Y_2$ | — | $Y_1$ | $X_2$ |
| $Y_3$ | — | $Y_2$ | $X_3$ |
| $Y_4$ | — | $Y_3$ | $X_4$ |

What is claimed is:

1. A register control punch assembly comprising a flat support surface said support surface having at least two longitudinally extending grooves formed in the upper face thereof, said longitudinally extending grooves being relatively positioned with respect to each other such that center line of the first groove intersects the center line of the second groove perpendicularly at a point intermediate the ends of said second groove, hole punching means having a plunger and a cooperating female die member adapted to punch a single hole in a sheet of material, said punching means being positioned such that the axis of said plunger thereof is perpendicular to said support surface and intersects said support surface at said intersection of said center lines of said two longitudinal grooves, means for retaining sheet material being punched by said plunger in a position normal to said axis of said plunger, and at least three vertical register hole guide pins, one of said guide pins being positioned within each of the resultant three legs of said two intersecting grooves in said support surface, means associated with each of said guide pins adapting said pins for slideable lateral movement along said grooves and for locking said pins in place at a preselected groove position, the axis of said plunger and the axes of two of said guide pins in said second groove all falling within a plane which is perpendicular to a plane passing through the axis of said plunger and the axis of said guide pin in said first groove, the cross-sectional area of said plunger and said guide pins at the level of said support surface being essentially identical.

2. A register control punch assembly according to claim 1 wherein the cross-sectional area of said plunger and said guide pins is circular.

3. A register control punch assembly according to claim 1 wherein said plunger and said female die member of said hole punching means are both integral with the body of said hole punching means.

4. A register control punch assembly according to claim 1 wherein said support surface is illuminatable from beneath said surface and provided with means to illuminate said support surface and objects placed thereon.

5. A register control punch assembly according to claim 1 wherein said grooves are provided with inwardly extending flanges on the vertical walls thereof, said means associated with each of said guide pins adapting said guide pins for slideable movement within said grooves includes two separate plate elements positioned within said grooves on opposite sides of said flanges and adapted for slideable movement along said grooves, said plate elements have vertical openings therethrough with the opening in the bottom plate element being threaded, and said guide pin elements each are provided with downwardly extending members which respectively are received in threaded cooperating engagement within the openings of said plate elements, whereby said pairs of plate elements may be brought into fixed engagement with said flanges and loosened therefrom by rotating said guide pins in opposite directions as desired.

6. A register control punch assembly according to claim 5 wherein the cross-sectional area of said plunger and said guide pins is circular.

7. A register control punch assembly according to claim 5 wherein said female die member of said hole punching means is integral with the body of said hole punching means.

8. A register control punch assembly according to claim 5 wherein said support surface is comprised of transparent material and means for illuminating said support surface and objects thereon is positioned beneath said support surface.

* * * * *